(12) United States Patent
Kosaka et al.

(10) Patent No.: US 9,806,039 B2
(45) Date of Patent: Oct. 31, 2017

(54) AMPLIFIER

(71) Applicant: MITSUBISHI ELECTRIC CORPORATION, Tokyo (JP)

(72) Inventors: Naoki Kosaka, Tokyo (JP); Hiroaki Maehara, Tokyo (JP); Ko Kanaya, Tokyo (JP); Miyo Miyashita, Tokyo (JP); Kazuya Yamamoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/993,131

(22) Filed: Jan. 12, 2016

(65) Prior Publication Data

US 2016/0308499 A1    Oct. 20, 2016

(30) Foreign Application Priority Data

Apr. 15, 2015    (JP) .................. 2015-083582

(51) Int. Cl.
*H01L 23/66* (2006.01)
*H01L 25/07* (2006.01)

(52) U.S. Cl.
CPC ............ *H01L 23/66* (2013.01); *H01L 25/072* (2013.01); *H01L 2224/49175* (2013.01)

(58) Field of Classification Search
CPC ..................................... H01L 23/66
USPC ..................... 330/295, 124 R, 307
See application file for complete search history.

(56) References Cited

U.S. PATENT DOCUMENTS

| | | | | |
|---|---|---|---|---|
| 6,060,951 | A * | 5/2000 | Inoue | H01L 23/4824 330/295 |
| 6,734,728 | B1 * | 5/2004 | Leighton | H01L 23/66 257/401 |
| 6,798,295 | B2 * | 9/2004 | Pengelly | H01L 23/66 257/E25.016 |

FOREIGN PATENT DOCUMENTS

| | | |
|---|---|---|
| JP | 9-018254 | 1/1997 |
| JP | 10-327031 | 12/1998 |
| JP | 2007-274181 A | 10/2007 |
| JP | 2011-129571 A | 6/2011 |
| JP | 2012-231294 A | 11/2012 |
| JP | 2014-222836 A | 11/2014 |

\* cited by examiner

*Primary Examiner* — Henry Choe
(74) *Attorney, Agent, or Firm* — Studebaker & Brackett PC

(57) ABSTRACT

In the present invention, in addition to arranging a plurality of amplifying elements in a staggered manner, signal path lengths from an input-side divider to gate pads of the plurality of amplifying elements are equalized, and signal path lengths from drain pads of the plurality of amplifying elements to an output-side combiner are equalized.

5 Claims, 12 Drawing Sheets

AMPLIFIER

BACKGROUND OF THE INVENTION

Field of the Invention

The present invention relates to an amplifier which combines outputs of a plurality of amplifying elements to obtain high output power.

Background Art

Japanese Patent Laid-Open No. H10-327031 discloses a high-output power amplifier including a plurality of amplifying elements. When signals of different phases are supplied to a plurality of amplifying elements, phase differences occur between the signals, and combining efficiency at the time of combining the signals decreases. To avoid this, in the amplifier of Japanese Patent Laid-Open No. H10-327031, a transmission line for sending a signal to an amplifying element through a short wire is lengthened, and a transmission line for sending a signal to an amplifying element through a long wire is shortened.

As described above, it is preferable that signals of the same phase are applied to a plurality of amplifying elements. However, in the case where the lengths of transmission lines are adjusted as in Japanese Patent Laid-Open No. H10-327031, it is not easy to realize high impedance characteristics of wires with transmission lines on a substrate, and a phase difference and an impedance difference cannot be sufficiently reduced. Accordingly, an imbalance occurs in the amplifier of Japanese Patent Laid-Open No. H10-327031. There has been a need for an amplifier which can reduce the imbalance and which is suitable for miniaturization.

SUMMARY OF THE INVENTION

The present invention has been made to solve the above-described problem, and an object of the present invention is to provide an amplifier which can reduce an imbalance and which is suitable for miniaturization.

The features and advantages of the present invention may be summarized as follows.

According to one aspect of the present invention, an amplifier includes a package, an input-side divider provided in the package, an output-side combiner provided in the package, a plurality of first amplifying elements provided along the input-side divider in the package, the plurality of first amplifying elements includes a first gate pad and a first drain pad, a plurality of second amplifying elements provided along the output-side combiner in the package, the plurality of second amplifying elements includes a second gate pad and a second drain pad and having the same shapes as the first amplifying elements, a first input wire connecting the input-side divider and the first gate pad, a second input wire connecting the input-side divider and the second gate pad, a first output wire connecting the first drain pad and the output-side combiner, and a second output wire connecting the second drain pad and the output-side combiner, wherein the plurality of first amplifying elements and the plurality of second amplifying elements are provided in a staggered manner, the first input wire has the same length as the second input wire, and the first output wire has the same length as the second output wire.

According to another aspect of the present invention, an amplifier includes a package, an input-side divider provided in the package, an output-side combiner provided in the package, a plurality of first amplifying elements provided along the input-side divider in the package, the plurality of first amplifying elements includes a first gate pad and a first drain pad, a plurality of second amplifying elements provided along the output-side combiner in the package, the plurality of second amplifying elements includes a second gate pad and a second drain pad and having the same shapes as the first amplifying element, an intermediate substrate provided between the plurality of first amplifying elements and the plurality of second amplifying elements, the intermediate substrate having a first pattern and a second pattern formed therein, an input wire connecting the input-side divider and the first gate pad, a first connecting wire connecting the input-side divider and the first pattern, a second connecting wire connecting the first pattern and the second gate pad, an output wire connecting the second drain pad and the output-side combiner, a third connecting wire connecting the first drain pad and the second pattern, and a fourth connecting wire connecting the second pattern and the output-side combiner, wherein the plurality of first amplifying elements and the plurality of second amplifying elements are provided in a staggered manner, a length of the input wire is equal to a sum of a length of the first connecting wire, a length of the second connecting wire, and a length between a point on the first pattern at which the first connecting wire is fixed and a point on the first pattern at which the second connecting wire is fixed, and a length of the output wire is equal to a sum of a length of the third connecting wire, a length of the fourth connecting wire, and a length between a point on the second pattern at which the third connecting wire is fixed and a point on the second pattern at which the fourth connecting wire is fixed.

Other and further objects, features and advantages of the invention will appear more fully from the following description.

DETAILED DESCRIPTION OF THE PREFERRED EMBODIMENTS

Amplifiers according to embodiments of the present invention will be described with reference to the drawings.

The same or corresponding components will be denoted by the same reference signs, and the repetition of explanation thereof may be omitted.

First Embodiment

Figure 1:
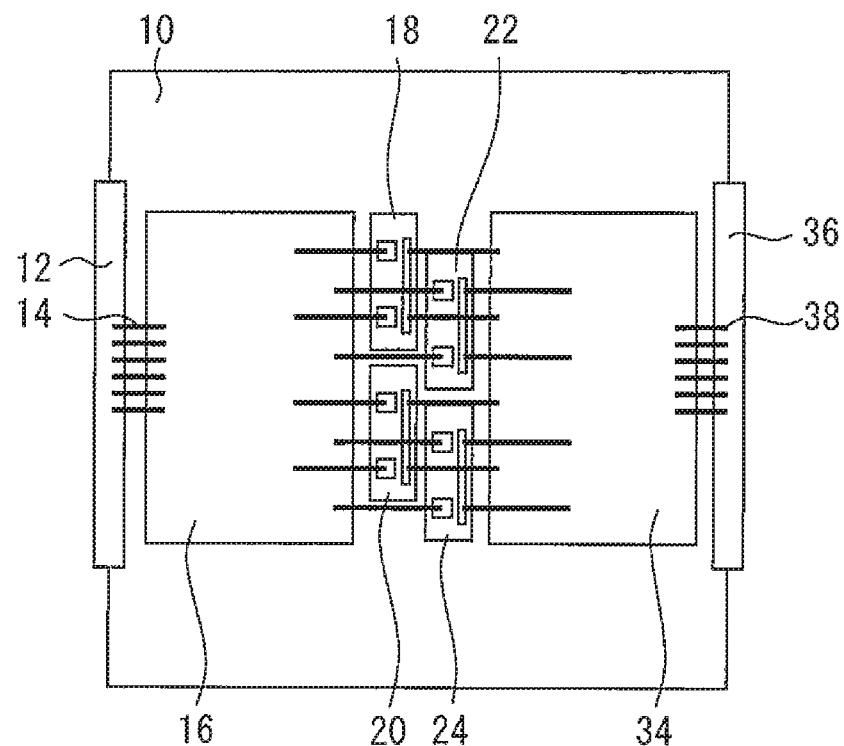
FIG. 1 is a plan view of an amplifier according to first embodiment.

FIG. 1 is a plan view of an amplifier according to first embodiment of the present invention. This amplifier includes a package 10. An input terminal 12 is attached to the package 10. An input-side divider 16 is provided in the package 10. The input-side divider 16 is formed by, for example, plating an alumina substrate with gold. The input-side divider 16 and the input terminal 12 are connected to each other with input terminal wires 14.

An output terminal 36 is attached to the package 10 to be opposite to the input terminal 12. An output-side combiner 34 is provided in the package 10. The output-side combiner 34 is formed by, for example, plating an alumina substrate with gold. The output-side combiner 34 and the output terminal 36 are connected to each other with output terminal wires 38.

First amplifying elements 18 and 20 are provided along the input-side divider 16. The first amplifying elements 18 and 20 are, for example, FET chips. The first amplifying elements 18 and 20 are rectangular in planar view. Second amplifying elements 22 and 24 are provided beside the first amplifying elements 18 and 20 to be located along the output-side combiner 34. The second amplifying elements 22 and 24 have the same shapes as the first amplifying elements 18 and 20.

The first amplifying elements 18 and 20 are arranged in a line in the longitudinal direction thereof. The second amplifying elements 22 and 24 are arranged in a line in the longitudinal direction thereof. In other words, amplifying elements are arranged in two rows in the element width direction. Three or more first amplifying elements may be arranged along the input-side divider 16, and three or more second amplifying elements may be arranged along the output-side combiner 34.

The first amplifying elements 18 and 20 and the second amplifying elements 22 and 24 are provided in a staggered manner. Specifically, one second amplifying element is provided beside one first amplifying element in an overlapping manner, but the two amplifying elements are provided such that the positions of the elements are shifted from each other in the longitudinal direction.

Figure 2:
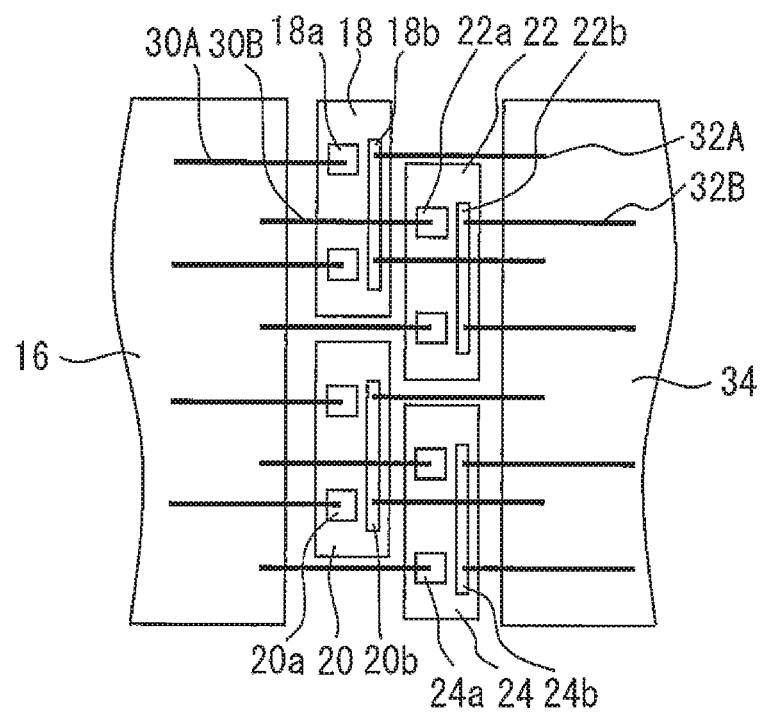
FIG. 2 is an enlarged view showing part of FIG. 1.

FIG. 2 is an enlarged view showing part of FIG. 1. The first amplifying element 18 includes two first gate pads 18a and a first drain pad 18b. The first amplifying element 20 includes two first gate pads 20a and a first drain pad 20b. The first gate pads 18a and 20a are located on the input-side divider 16 side, and the first drain pads 18b and 20b are on the output-side combiner 34 side.

The second amplifying element 22 includes two second gate pads 22a and a second drain pad 22b. The second amplifying element 24 includes two second gate pads 24a and a second drain pad 24b. The second gate pads 22a and 24a are located on the input-side divider 16 side, and the second drain pads 22b and 24b are on the output-side combiner 34 side.

The input-side divider 16 and the first gate pads 18a and 20a are connected to each other with first input wires 30A. There are provided a plurality of (four) first input wires 30A. The input-side divider 16 and the second gate pads 22a and 24a are connected to each other with second input wires 30B. There are provided a plurality of (four) second input wires 30B. The lengths of the first input wires 30A and the second input wires 30B are equal.

The first drain pads 18b and 20b and the output-side combiner 34 are connected to each other with first output wires 32A. There are provided a plurality of (four) first output wires 32A. The second drain pads 22b and 24b and the output-side combiner 34 are connected to each other with second output wires 32B. There are provided a plurality of (four) second output wires 32B. The lengths of the first output wires 32A and the second output wires 32B are equal. The above-described wires are, for example, gold wires.

A high-frequency signal is transmitted from the input terminal 12 through the input terminal wires 14 to the input-side divider 16. Then, the high-frequency signal is distributed to the first input wires 30A and the second input wires 30B and amplified by amplifying elements. The amplified high-frequency signals pass through the first output wires 32A and the second output wires 32B to be combined by the output-side combiner 34. The resultant signal passes through the output terminal wires 38 to the output terminal 36. Thus, this amplifier constitutes a high-output amplifier of a dividing and combining type.

Figure 3:
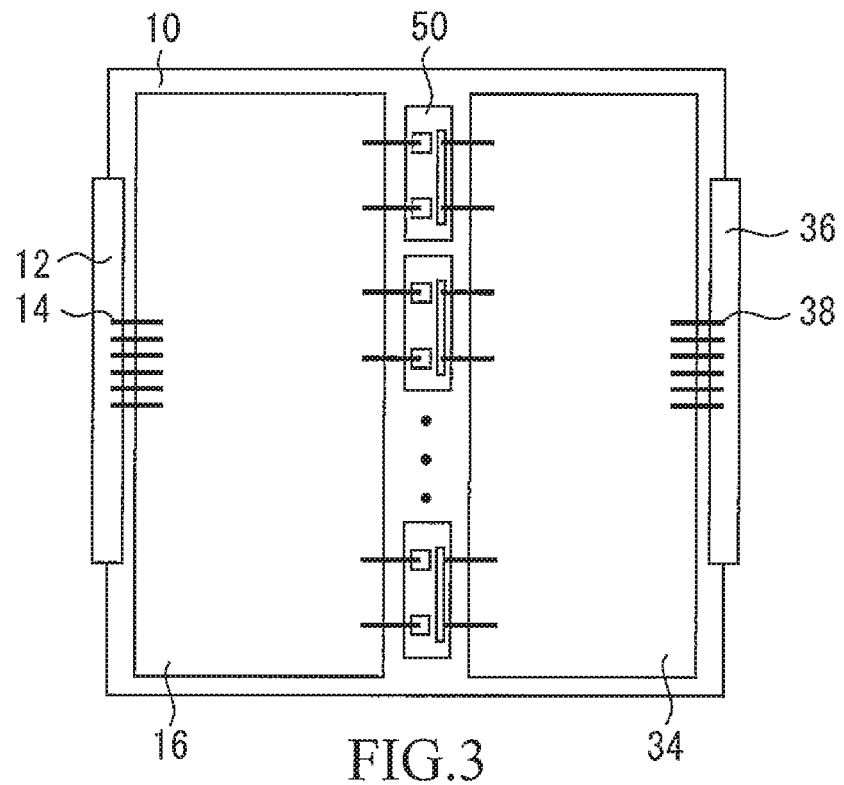
FIG. 3 is a plan view of an amplifier according to a comparative example.

FIG. 3 is a plan view of an amplifier according to a comparative example. In the amplifier of the comparative example, a plurality of amplifying elements 50 are arranged in a line along the input-side divider 16. In this case, a space which is wide in the longitudinal direction of the amplifying elements is required, and the miniaturization of the amplifier is difficult.

Meanwhile, the amplifier according to first embodiment of the present invention does not require a space which is wide in the longitudinal direction of the amplifying elements because a plurality of amplifying elements are provided in a staggered pattern, and is suitable for miniaturization. In the case where amplifying elements are added to the amplifier of FIG. 1, additional amplifying elements are provided between the second amplifying elements 22 and 24 and the output-side combiner 34 such that a staggered pattern is formed. Accordingly, if the number of amplifying elements is increased, a space which is wide in the longitudinal direction of the amplifying elements is not required, and only a space which has a certain width in the width direction of the amplifying elements is required. Moreover, in the case where a large number of amplifying elements are arranged in the width direction of amplifying elements, the amount of an increase in the space occupied by amplifying elements is absorbed by bending (deforming) the input-side divider 16 or the output-side combiner 34. Further, providing a plurality of amplifying elements in a staggered pattern can prevent wire interference such as contact between the first input wire 30A and the second input wire 30B.

In the amplifier according to first embodiment of the present invention, since the lengths of the first input wires 30A and the second input wires 30B are equal, signals of the same phase can be transmitted to the first amplifying elements 18 and 20 and the second amplifying elements 22 and 24. Further, since the lengths of the first output wires 32A and the second output wires 32B are equal, output powers of the amplifying elements are combined in the same phase by the output-side combiner 34. Accordingly, a reduction in combining efficiency which would be caused by combining output powers of different phases can be prevented. Thus, an imbalance can be reduced.

By the way, there are cases where amplifying elements are lengthened in the width direction of the amplifying elements to increase the output power of the amplifier. In the case where amplifying elements become large in this way, phase differences in the amplifying elements occur in a high-frequency band to cause unevenness between the respective operations of the amplifying elements, and reduce the output powers and the efficiencies of the amplifying elements. However, the amplifier according to first embodiment of the present invention has a configuration which is suitable for miniaturization even when the number of amplifying elements is increased, and therefore there is no need to lengthen the amplifying elements in the width direction. Accordingly, the output power of the amplifier can be increased only by increasing the number of amplifying elements without increasing the widths of the amplifying elements. Thus, by maintaining phase differences in the amplifying elements in a high-frequency band, the above-described adverse effect can be avoided, and the output power of the amplifier can be increased.

In the case where a plurality of amplifying elements are provided in a staggered pattern, wires should be prevented from contacting the amplifying elements. To prevent wires from contacting amplifying elements at unintended positions, it is preferable that the input-side divider 16 and the output-side combiner 34 are sufficiently thicker than the amplifying elements. This allows, for example, the second input wires 30B to be provided sufficiently above the first amplifying elements 18 and 20, and the first output wires 32A to be provided sufficiently above the second amplifying elements 22 and 24. The chip thickness of a general amplifying element is 100 µm or less. Accordingly, the input-side divider 16 and the output-side combiner 34 are preferably gold-plated alumina substrates each having, for example, a thickness of any one of 0.2 mm, 0.254 mm, 0.635 mm, and 1 mm so that contact between wires and amplifying elements may be prevented. Alternatively, the input-side divider 16 and the output-side combiner 34 may be gold-plated high-permittivity substrates each having, for example, a thickness of any one of 0.18 mm, 0.2 mm, 0.25 mm, 0.3 mm, 0.38 mm, and 0.4 mm and a relative permittivity of any one of 38, 89, and 150.

The amplifier according to first embodiment of the present invention can be variously modified within a range in which features thereof are not lost. For example, in the case where there is a space in the longitudinal direction of amplifying elements, three or more amplifying elements may be arranged in the longitudinal direction of the amplifying elements. The same is true in embodiments below. It should be noted that amplifiers according to the embodiments below have many things in common with that of first embodiment, and therefore differences from first embodiment will be mainly described.

Second Embodiment

Figure 4:
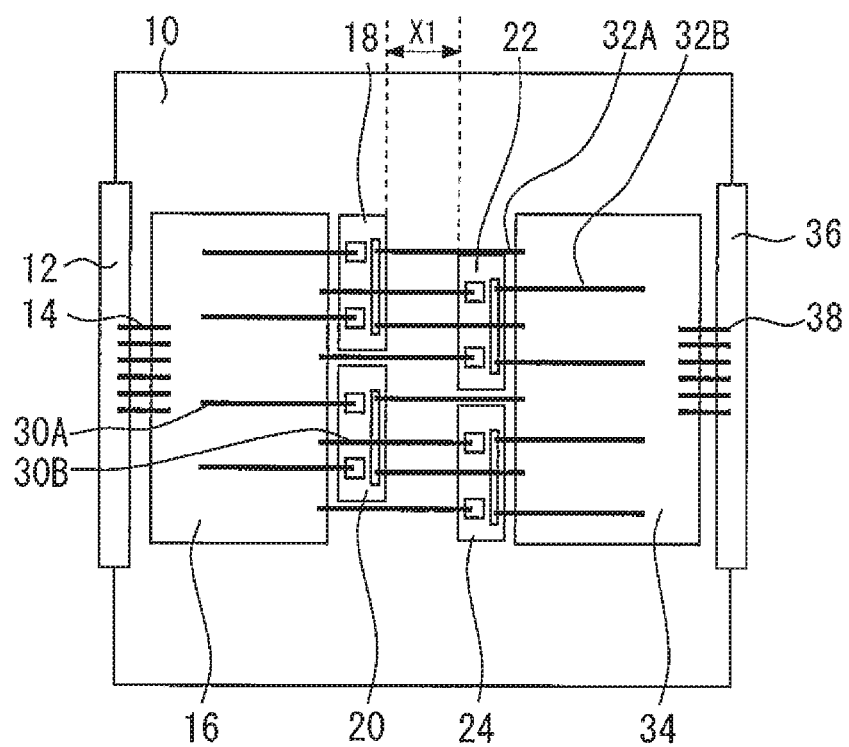
FIG. 4 is a plan view of an amplifier according to second embodiment.

FIG. 4 is a plan view of an amplifier according to second embodiment. The spacing (X1) between the first amplifying elements 18 and 20 and the second amplifying elements 22 and 24 is not less than 2 mm nor more than 4 mm. By providing a sufficient spacing between the first amplifying elements 18 and 20 and the second amplifying elements 22 and 24, the plurality of amplifying elements raised to high temperatures during operation can be prevented from heating up each other and decreasing the output powers of the amplifying elements.

Figure 5:
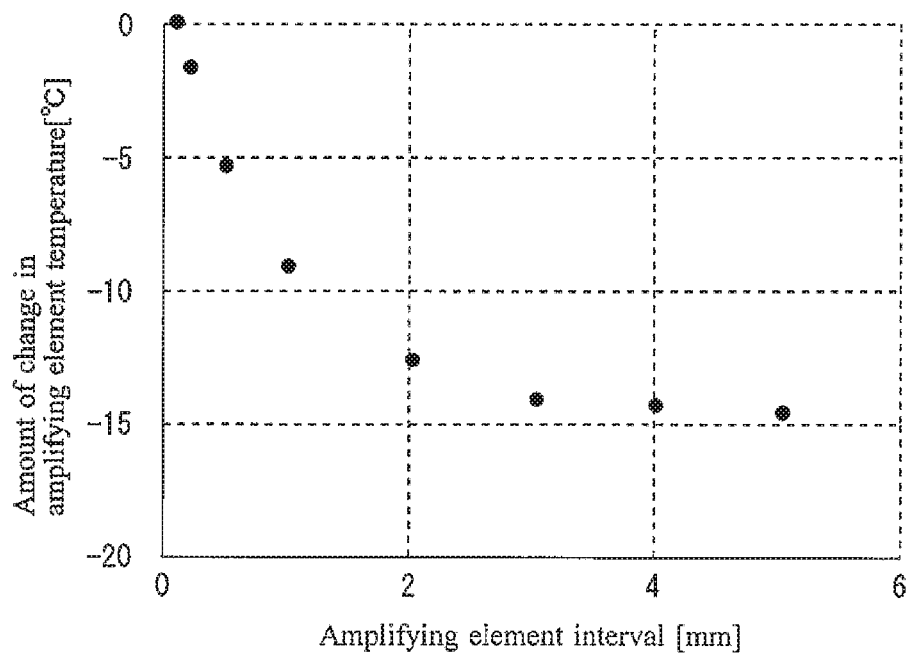
FIG. 5 is a graph showing results of simulation.

FIG. 5 is a graph showing results of simulation of the relationship between amplifying element interval and amplifying element temperature. The horizontal axis is the amplifying element interval in the short-side direction of the amplifying elements. A model used in this simulation is an amplifier in which an amplifying element as a heat source has a width of 1 mm, a length of 4 mm, and a thickness of 0.1 mm; in which two amplifying elements are arranged in the element width direction; and in which three amplifying elements are mounted at a spacing of 0.1 mm in the element longitudinal direction. The amplifying elements are assumed to be mounted on a copper base. As can be seen in FIG. 5, the amount of change in amplifying element temperature comes close to saturation when the amplifying element interval reaches 2 mm, and there is little correlation between amplifying element temperature and amplifying element interval when the interval is 4 mm or more. Accordingly, mutual heating-up of the amplifying elements can be suppressed by setting the amplifying element interval to not less than 2 mm nor more than 4 mm.

Third Embodiment

Figure 6:
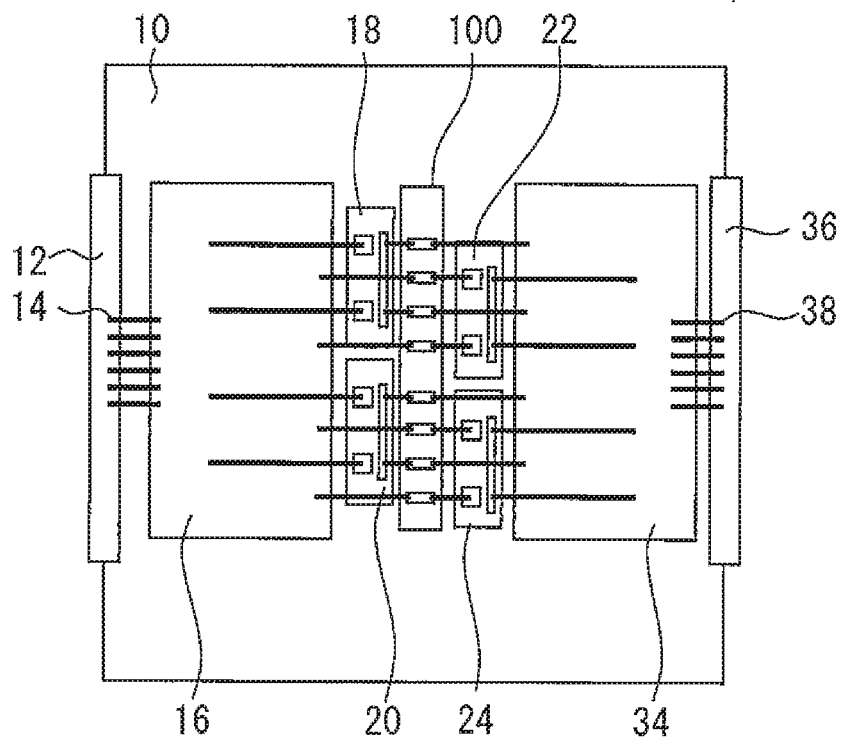
FIG. 6 is a plan view of an amplifier according to third embodiment.
Figure 7:
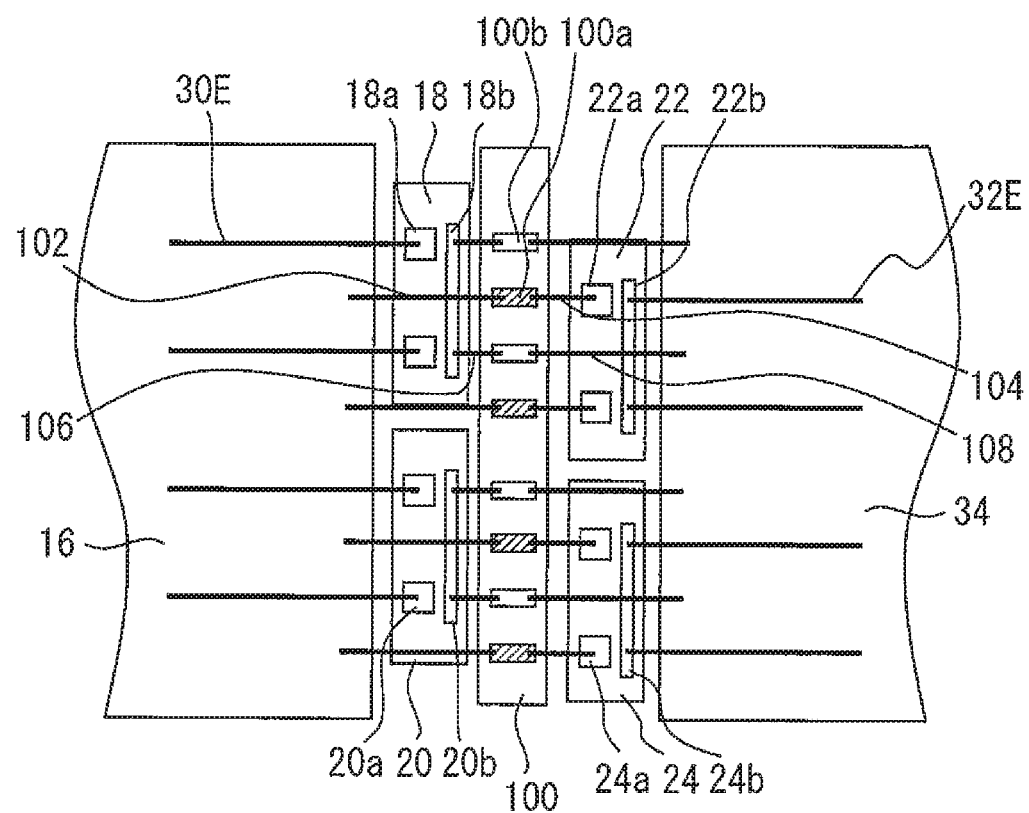
FIG. 7 is an enlarged view showing part of FIG. 6.

FIG. 6 is a plan view of an amplifier according to third embodiment. An intermediate substrate 100 (through-line substrate) is provided between the first amplifying elements 18 and 20 and the second amplifying elements 22 and 24. FIG. 7 is an enlarged view showing part of FIG. 6. The intermediate substrate 100 includes an alumina substrate having, for example, a thickness of any one of 0.2 mm, 0.254 mm, 0.635 mm, and 1 mm. First patterns 100a and second patterns 100b are formed on the alumina substrate. The first patterns 100a and the second patterns 100b each have a narrow shape having a width of, for example, 0.1 mm.

The input-side divider 16 and the first gate pads 18a and 20a are connected to each other with input wires 30E. The input-side divider 16 and the first patterns 100a are connected to each other with first connecting wires 102. The first patterns 100a and the second gate pads 22a and 24a are connected to each other with second connecting wires 104.

The second drain pads 22b and 24b and the output-side combiner 34 are connected to each other with output wires 32E. The first drain pads 18b and 20b and the second patterns 100b are connected to each other with third connecting wires 106. The second patterns 100b and the output-side combiner 34 are connected to each other with fourth connecting wires 108.

The length of the input wire 30E is equal to the sum of the length of the first connecting wire 102, the length of the second connecting wire 104, and the length between the point on the first pattern 100a to which the first connecting wire 102 is fixed and the point on the first pattern 100a to which the second connecting wire 104 is fixed. Thus, signal path lengths from the input-side divider 16 to the first gate pads 18a and 20a are equal to signal path lengths from the input-side divider 16 to the second gate pads 22a and 24a.

The length of the output wire 32E is equal to the sum of the length of the third connecting wire 106, the length of the fourth connecting wire 108, and the length between the point on the second pattern 100b to which the third connecting wire 106 is fixed and the point on the second pattern 100b to which the fourth connecting wire 108 is fixed. Thus, signal path lengths from the first drain pads 18b and 20b to the output-side combiner 34 are equal to signal path lengths from the second drain pads 22b and 24b to the output-side combiner 34.

In the amplifier according to third embodiment of the present invention, mutual heating-up of the amplifying elements can be prevented by providing a sufficient distance between the first amplifying elements 18 and 20 and the second amplifying elements 22 and 24. However, if the spacing between amplifying elements is increased, the first and second input wires and the first and second output wires need to be lengthened accordingly. If the wires are lengthened, manufacturing variations in wire lengths increase to cause unevenness between the respective operations of the amplifying elements, and may cause characteristic degradation such as a decrease in output power or efficiency.

Accordingly, in third embodiment of the present invention, an intermediate substrate 100 having smaller variations than wire connection is provided between amplifying elements. Wire lengths are reduced by an amount corresponding to the provision of the intermediate substrate 100, and variations in wire length can be reduced.

Fourth Embodiment

Figure 8:
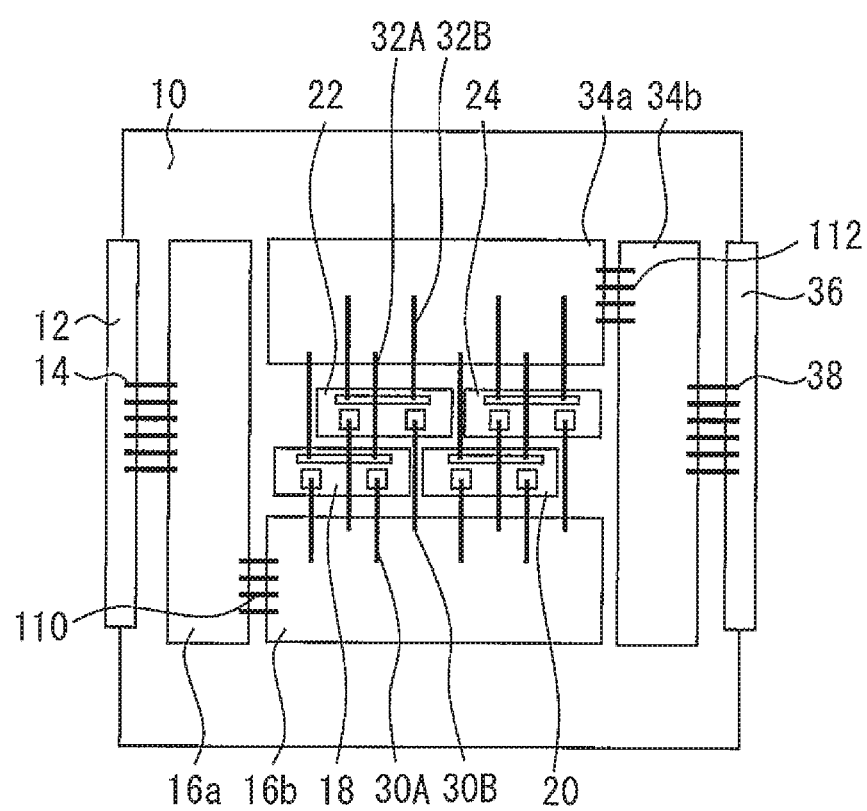
FIG. 8 is a plan view of an amplifier according to fourth embodiment.

FIG. 8 is a plan view of an amplifier according to fourth embodiment. The first amplifying elements 18 and 20 and the second amplifying elements 22 and 24 are located at positions to which the amplifying elements of FIG. 1 are rotated by 90 degrees. Accordingly, signal input directions to the first amplifying elements 18 and 20, signal output directions of the first amplifying elements 18 and 20, signal input directions to the second amplifying elements 22 and 24, and signal output directions of the second amplifying elements 22 and 24 are directions intersecting a line connecting the input terminal 12 and the output terminal 36. The direction parallel to the line connecting the input terminal 12 and the output terminal 36 is referred to as a transmission direction.

There are provided two input-side dividers. An input-side divider 16a is connected to the input terminal wires 14. The shape of the input-side divider 16a is a rectangle which is long in the direction perpendicular to the transmission direction. An input-side divider 16b is connected to the input-side divider 16a through wires 110. The shape of the input-side divider 16b is a rectangle which is long in the transmission direction. The first input wires 30A and the second input wires 30B extend in the direction perpendicular to the transmission direction to connect the input-side divider 16b and the amplifying elements.

There are provided two output-side combiners. An output-side combiner 34b is connected to the output terminal wires 38. The shape of the output-side combiner 34b is a rectangle which is long in the direction perpendicular to the transmission direction. An output-side combiner 34a is connected to the output-side combiner 34b through wires 112. The shape of the output-side combiner 34a is a rectangle which is long in the transmission direction. The first output wires 32A and the second output wires 32B extend in the direction perpendicular to the transmission direction to connect the amplifying elements and the output-side combiner 34a.

Figure 9:
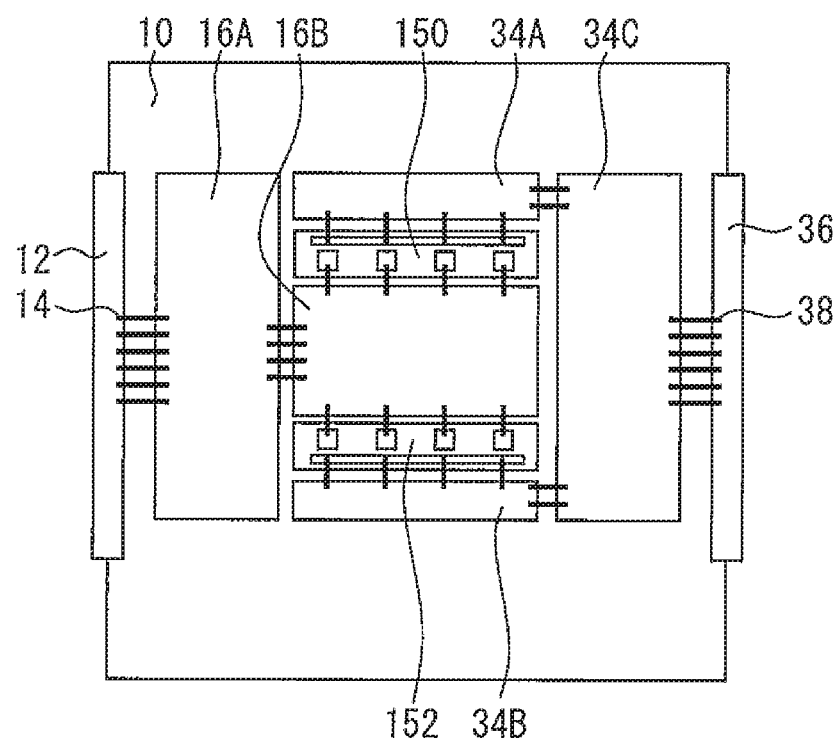
FIG. 9 is a plan view of an amplifier according to a comparative example.

FIG. 9 is a plan view of an amplifier according to a comparative example. In the amplifier of the comparative example, a high-frequency signal is transmitted from the input-side divider 16A to the input-side divider 16B, and travels in the direction (vertical direction in FIG. 9) perpendicular to the transmission direction to be amplified by amplifying elements. Signals amplified by an amplifying element 150 pass through an output-side combiner 34A to an output-side combiner 34C. Signals amplified by an amplifying element 152 pass through an output-side combiner 34B to the output-side combiner 34C. Accordingly, three output-side combiners 34A, 34B, and 34C are needed.

In the case where the direction from the gate pads toward the drain pad of the amplifying element 150 and the direction from the gate pads toward the drain pad of the amplifying element 152 are opposite to each other as in this comparative example, separate matching circuit substrates (output-side combiners) need to be prepared for the amplifying elements 150 and 152, respectively.

Meanwhile, in the amplifier according to fourth embodiment of the present invention, directions from gate pads toward drain pads of all amplifying elements are the same, and therefore output-side combiners can be unified into a single one. Accordingly, the number of substrates can be made smaller than that of the amplifier of the comparative example.

Figure 10:
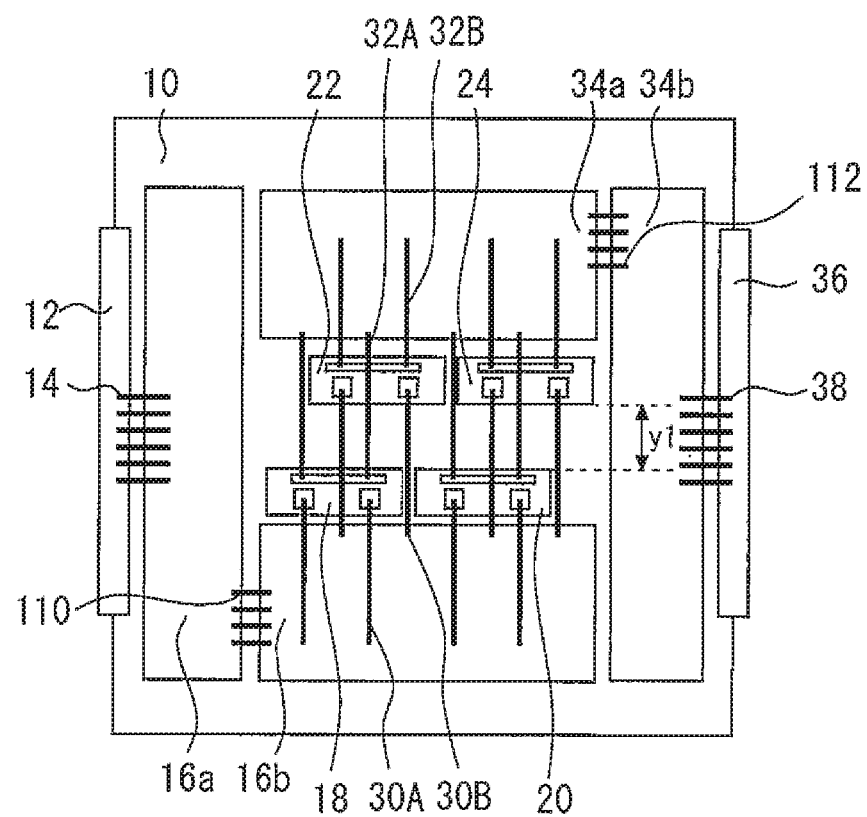
FIG. 10 is a plan view of an amplifier according to a modified embodiment.

FIG. 10 is a plan view of an amplifier according to a modified embodiment. The spacing between the first amplifying elements 18 and 20 and the second amplifying elements 22 and 24 is not less than 2 mm nor more than 4 mm. Thus, the amplifying elements can be prevented from heating up each other.

Figure 11:
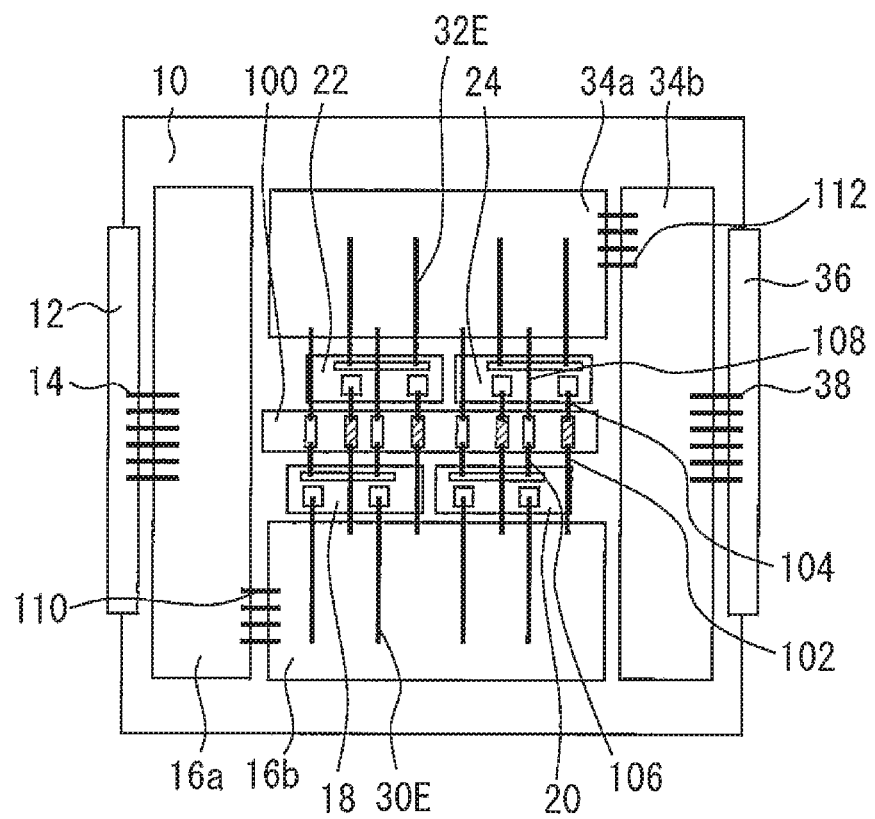
FIG. 11 is a plan view of an amplifier according to another modified embodiment.

FIG. 11 is a plan view of an amplifier according to another modified embodiment. An intermediate substrate 100 is provided between the first amplifying elements 18 and 20 and the second amplifying elements 22 and 24. The lengths of wires connecting to gate pads and drain pads of the amplifying elements are adjusted so that an imbalance may not occur as explained in third embodiment. Accordingly, heat characteristics can be improved by providing a sufficient spacing between the first amplifying elements 18 and 20 and the second amplifying elements 22 and 24, and variations in wire length can be reduced with the intermediate substrate 100. It should be noted that the amplifier according to fourth embodiment of the present invention can be variously modified within a range in which features thereof are not lost, other than the above-described modification.

Fifth Embodiment

The amplifying elements of embodiments 1 to 4 each have a multi-cell structure in which a plurality of unit cell transistors are incorporated in one amplifying element (FET chip). Meanwhile, an amplifying element of fifth embodiment is formed to have a unit-cell structure in which one unit cell transistor is provided in one amplifying element (FET chip).

Figure 12:
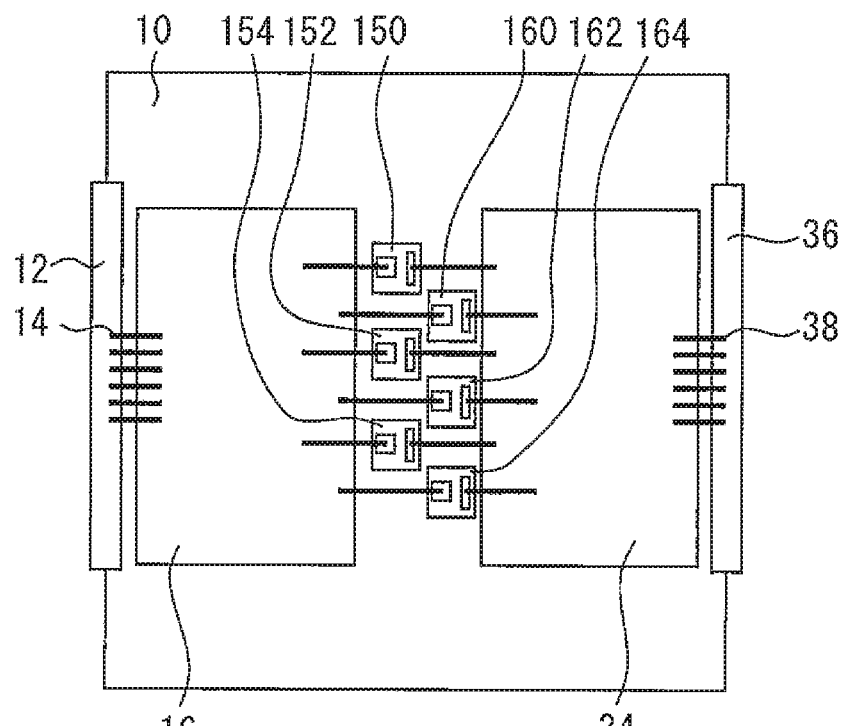
FIG. 12 is a plan view of an amplifier according to fifth embodiment.

FIG. 12 is a plan view of an amplifier according to fifth embodiment. Each of amplifying elements 150, 152, and 154 is formed by a unit cell. Each of second amplifying elements 160, 162, and 164 is also formed by a unit cell. An amplifying element of a unit-cell structure has a smaller chip size than an amplifying element of a multi-cell structure. Accordingly, the spacing between amplifying elements can be increased, and therefore rises in amplifying element temperatures can be easily reduced. For example, in the case where amplifying elements of multi-cell structures are employed, element temperatures increase, and outputs of the amplifying elements may decrease. In such a case, rises in element temperatures can be reduced by employing amplifying elements of unit-cell structures as in FIG. 12.

Figure 13:
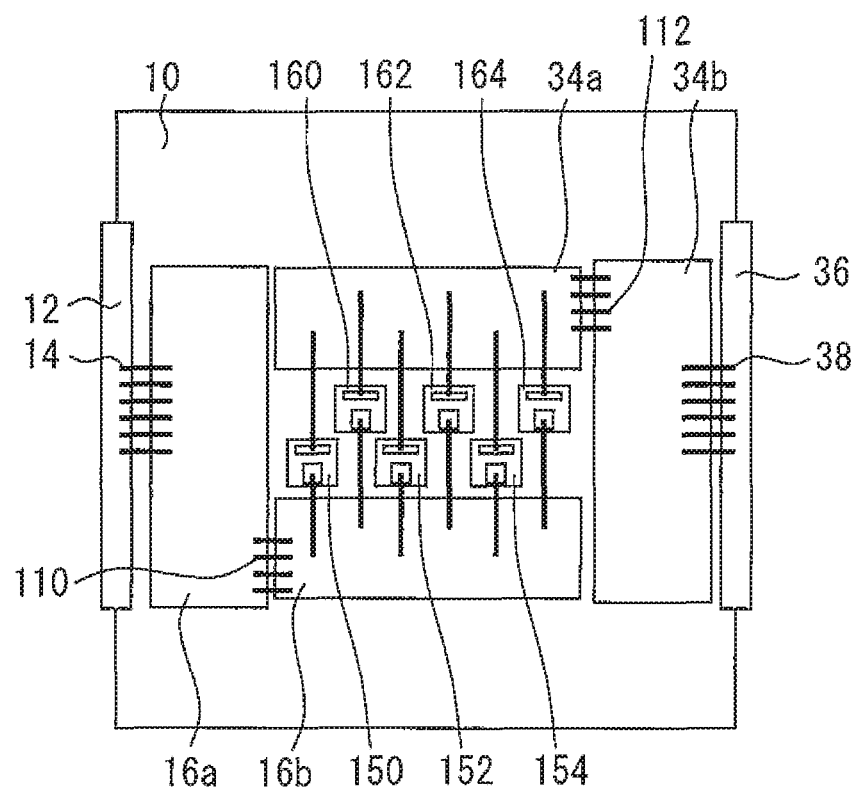
FIG. 13 is a plan view of an amplifier according to a modified embodiment.

FIG. 13 is a plan view of an amplifier according to a modified embodiment. Amplifying elements of unit-cell structures of FIG. 13 are located at positions to which the amplifying elements of FIG. 12 are rotated by 90 degrees. Disposing amplifying elements in this way increases the degree of layout freedom of components constituting the amplifier.

Sixth Embodiment

Figure 14:
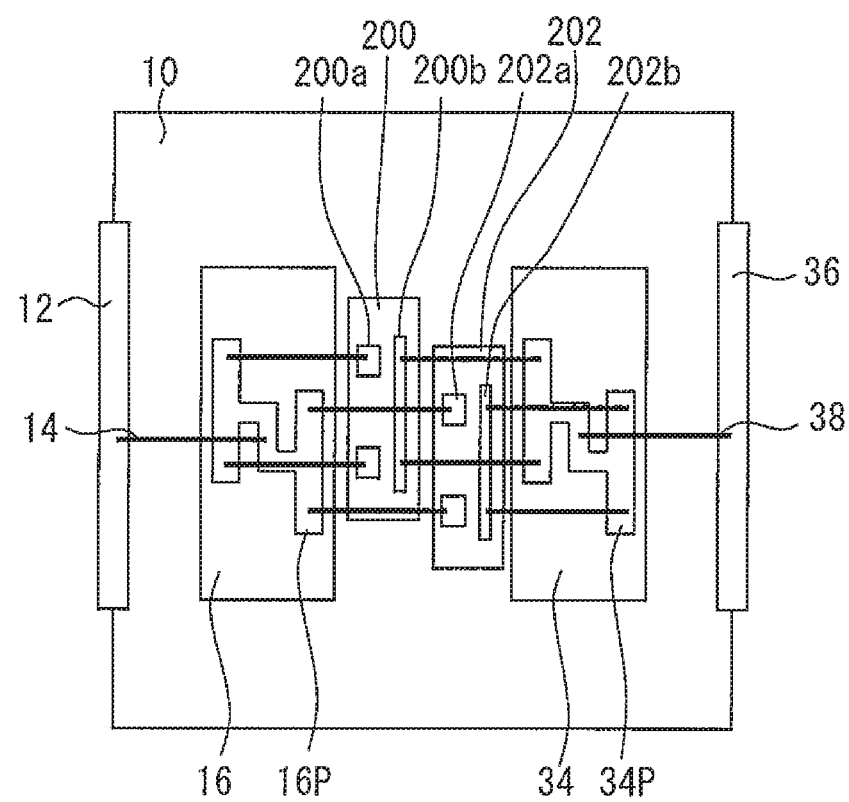
FIG. 14 is a plan view of an amplifier according to sixth embodiment.

FIG. 14 is a plan view of an amplifier according to sixth embodiment. An input-side divider 16 having a divider pattern 16P formed therein is provided. An input terminal wire 14 connects the input terminal 12 and the divider pattern 16P. Further, this amplifier includes an output-side combiner 34 having a combiner pattern 34P formed therein. An output terminal wire 38 connects the output terminal 36 and the combiner pattern 34P. A first amplifying element 200 having gate pads 200a and a drain pad 200b and a second amplifying element 202 having gate pads 202a and a drain pad 202b are provided between the input-side divider 16 and the output-side combiner 34.

Figure 15:
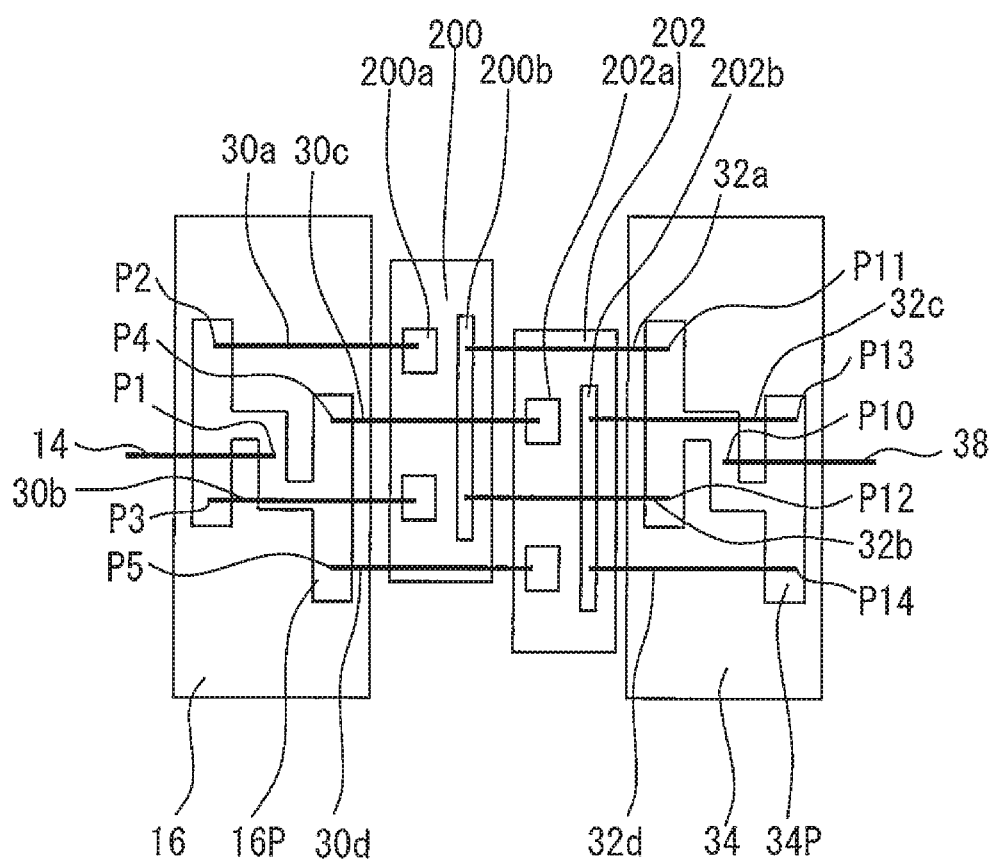
FIG. 15 is an enlarged view showing part of FIG. 14.

FIG. 15 is an enlarged view showing part of FIG. 14. A position on the divider pattern 16P to which the input terminal wire 14 is attached is referred to as an input point P1. The gate pads 200a of the first amplifying element 200 and the divider pattern 16P are connected to each other with first input wires 30a and 30b. Positions on the divider pattern 16P to which the first input wires 30a and 30b are connected are output points P2 and P3.

The gate pads 202a of the second amplifying element 202 and the divider pattern 16P are connected to each other with second input wires 30c and 30d. Positions on the divider pattern 16P to which the second input wires 30c and 30d are connected are output points P4 and P5. Further, the divider pattern 16P is formed so that signal path lengths from the input point P1 to the output points P2, P3, P4, and P5 may be equal.

A position on the combiner pattern 34P to which the output terminal wire 38 is attached is referred to as an output point P10. The drain pad 200b of the first amplifying element 200 and the combiner pattern 34P are connected to each other with the first output wires 32a and 32b. Positions on the combiner pattern 34P to which the first output wires 32a and 32b are connected are input points P11 and P12.

The drain pad 202b of the second amplifying element 202 and the combiner pattern 34P are connected to each other with second output wires 32c and 32d. Positions on the combiner pattern 34P to which the second output wires 32c and 32d are connected are input points P13 and P14. Further, the combiner pattern 34P is formed so that signal path lengths from the output point P10 to the input points P11, P12, P13, and P14 may be equal.

It is preferable to reduce variations in the operations of all amplifying elements and cause all the amplifying elements to evenly operate. Accordingly, in sixth embodiment of the present invention, the wire lengths of the first input wires 30a and 30b and the second input wires 30c and 30d are equalized. Further, signal path lengths from the input point P1 to the output points P2, P3, P4, and P5 are made equal by adjusting the shape of the divider pattern 16P. Furthermore, the wire lengths of the first output wires 32a and 32b and the second output wires 32c and 32d are equalized. Moreover, signal path lengths from the output point P10 to the input points P11, P12, P13, and P14 are made equal by adjusting the shape of the combiner pattern 34P. Accordingly, an imbalance in the circuit can be eliminated, and a plurality of amplifying element can be caused to evenly operate. It should be noted that in the case where the number of amplifying elements is increased from that in the configuration of FIG. 15, the numbers of divider patterns and combiner patterns are increased accordingly.

Figure 16:
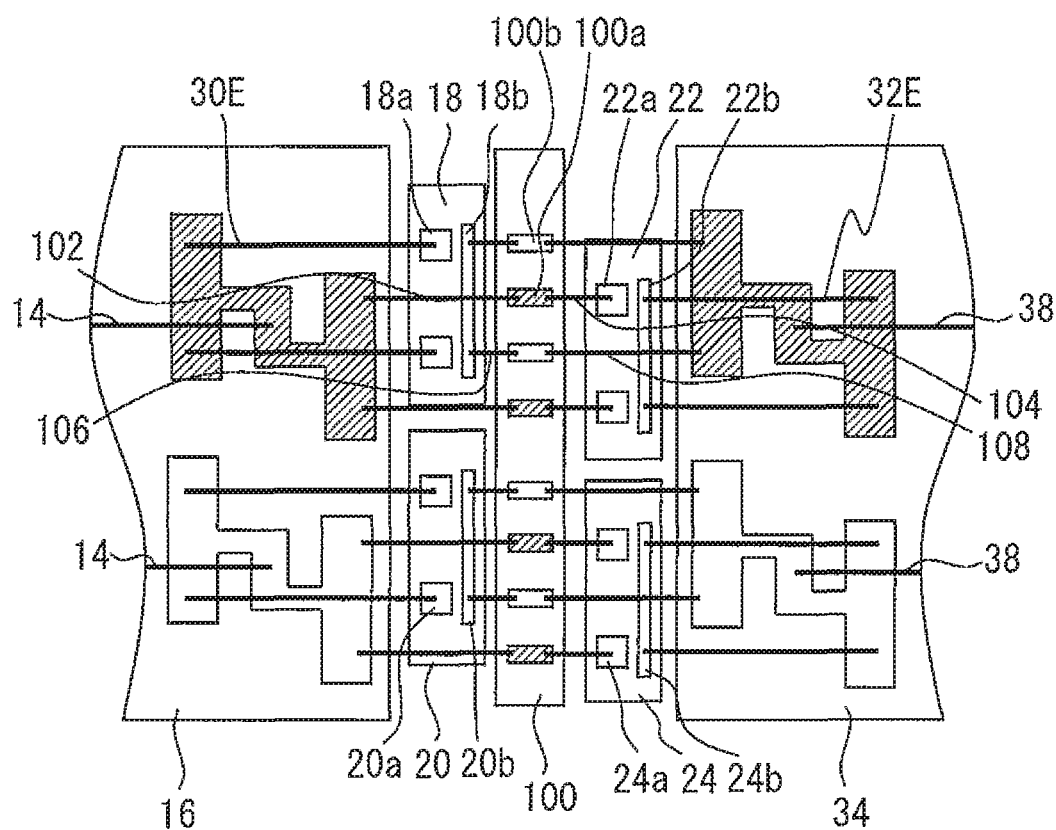
FIG. 16 is a plan view of an amplifier according to a modified embodiment.

The above-described method for adjusting the divider pattern and the combiner pattern can be applied to an amplifier with an intermediate substrate. FIG. 16 is a plan view of an amplifier according to a modified embodiment. The input wires 30E and the first connecting wires 102 are connected to divider patterns. Both of the two divider patterns are formed so that signal path lengths from input points, to which the input terminal wires 14 are attached, to output points, to which the input wires 30E and the first connecting wires 102 are connected, may be equal.

The fourth connecting wires 108 and the output wires 32E are connected to combiner patterns. Both of the two combiner patterns are formed so that signal path lengths from output points, to which the output terminal wires 38 are attached, to input points, to which the fourth connecting wires 108 and the output wires 32E are connected, may be equal.

In the case where a slight imbalance is acceptable, divider patterns or combiner patterns may be omitted in the configurations of FIGS. 14 to 16. The omission of divider patterns or combiner patterns can reduce manufacturing cost. It should be noted that features of the amplifiers according to the embodiments described above may be combined as appropriate.

In the present invention, in addition to arranging a plurality of amplifying elements in a staggered manner, signal path lengths from an input-side divider to gate pads of the plurality of amplifying elements are equalized, and signal path lengths from drain pads of the plurality of amplifying elements to an output-side combiner are equalized. Accordingly, an amplifier can be provided which can reduce an imbalance and which is suitable for miniaturization.

Obviously many modifications and variations of the present invention are possible in the light of the above teachings. It is therefore to be understood that within the scope of the appended claims the invention may be practiced otherwise than as specifically described.

What is claimed is:
1. An amplifier comprising:
a package;
an input-side divider provided in the package;
an output-side combiner provided in the package;
a plurality of first amplifying elements provided along the input-side divider in the package, the plurality of first amplifying elements comprising a first gate pad and a first drain pad;
a plurality of second amplifying elements provided along the output-side combiner in the package, the plurality of second amplifying elements comprising a second gate pad and a second drain pad and having the same shapes as the first amplifying element;
an intermediate substrate provided between the plurality of first amplifying elements and the plurality of second amplifying elements, the intermediate substrate having a first pattern and a second pattern formed therein;
an input wire connecting the input-side divider and the first gate pad;
a first connecting wire connecting the input-side divider and the first pattern;
a second connecting wire connecting the first pattern and the second gate pad;
an output wire connecting the second drain pad and the output-side combiner;
a third connecting wire connecting the first drain pad and the second pattern; and
a fourth connecting wire connecting the second pattern and the output-side combiner,
wherein the plurality of first amplifying elements and the plurality of second amplifying elements are provided in a staggered manner,
a length of the input wire is equal to a sum of a length of the first connecting wire, a length of the second connecting wire, and a length between a point on the first pattern at which the first connecting wire is fixed and a point on the first pattern at which the second connecting wire is fixed, and a length of the output wire is equal to a sum of a length of the third connecting wire, a length of the fourth connecting wire, and a length between a point on the second pattern at which the third connecting wire is fixed and a point on the second pattern at which the fourth connecting wire is fixed.

2. The amplifier according to claim 1, wherein
the intermediate substrate comprises an alumina substrate having a thickness of any one of 0.2 mm, 0.254 mm, 0.635 mm, and 1 mm,
the first pattern and the second pattern are provided on the alumina substrate, and
widths of the first pattern and the second pattern are 0.1 mm.

3. The amplifier according to claim 1, further comprising:
an input terminal attached to the package;
an output terminal attached to the package;
a divider pattern as a pattern of the input-side divider; and
an input terminal wire connecting the input terminal and the divider pattern,
wherein the input wire and the first connecting wire are connected to the divider pattern, and
the divider pattern is formed so that signal path lengths from an input point, to which the input terminal wire is attached, to output points, to which the input wire and the first connecting wire are connected, are equal.

4. The amplifier according to claim 1, further comprising:
an input terminal attached to the package;
an output terminal attached to the package;
a combiner pattern as a pattern of the output-side combiner; and
an output terminal wire connecting the output terminal and the combiner pattern,
wherein the fourth connecting wire and the output wire are connected to the combiner pattern, and
the combiner pattern is formed so that signal path lengths from an output point, to which the output terminal wire is attached, to input points, to which the fourth connecting wire and the output wire are connected, are equal.

5. An amplifier comprising:
a package;
an input-side divider provided in the package;
an output-side combiner provided in the package;
a plurality of first amplifying elements provided along the input-side divider in the package, the plurality of first amplifying elements comprising a first gate pad and a first drain pad;
a plurality of second amplifying elements provided along the output-side combiner in the package, the plurality of second amplifying elements comprising a second gate pad and a second drain pad and having the same shapes as the first amplifying elements;
a first input wire connecting the input-side divider and the first gate pad;
a second input wire connecting the input-side divider and the second gate pad;
a first output wire connecting the first drain pad and the output-side combiner; and
a second output wire connecting the second drain pad and the output-side combiner,
wherein the plurality of first amplifying elements and the plurality of second amplifying elements are provided in a staggered manner,
the first input wire has the same length as the second input wire,
the first output wire has the same length as the second output wire, and
each of the input-side divider and the output-side combiner is any one of a gold-plated alumina substrate having a thickness of any one of 0.2 mm, 0.254 mm, 0.635 mm, and 1 mm and a gold-plated high-permittivity substrate having a thickness of any one of 0.18 mm, 0.2 mm, 0.25 mm, 0.3 mm, 0.38 mm, and 0.4 mm and having a relative permittivity of any one of 38, 89, and 150.

* * * * *